United States Patent
Arai et al.

(10) Patent No.: US 7,655,871 B2
(45) Date of Patent: Feb. 2, 2010

(54) RESIN COMPOSITION, RESIN-ATTACHED METAL FOIL, BASE MATERIAL-ATTACHED INSULATING SHEET AND MULTIPLE-LAYERED PRINTED WIRING BOARD

(75) Inventors: Masataka Arai, Tokyo (JP); Takeshi Hosomi, Tokyo (JP); Hiroaki Wakabayashi, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 224 days.

(21) Appl. No.: 10/594,206

(22) PCT Filed: Mar. 23, 2005

(86) PCT No.: PCT/JP2005/005261

§ 371 (c)(1),
(2), (4) Date: Jul. 17, 2007

(87) PCT Pub. No.: WO2005/092945

PCT Pub. Date: Oct. 6, 2005

(65) Prior Publication Data

US 2008/0254300 A1 Oct. 16, 2008

(30) Foreign Application Priority Data

Mar. 29, 2004 (JP) .............................. 2004-094654

(51) Int. Cl.
*H05K 1/00* (2006.01)
*B32B 15/00* (2006.01)
(52) U.S. Cl. ................ 174/258; 428/327; 428/413; 428/417; 428/418; 523/446; 525/524
(58) Field of Classification Search ................ 428/209, 428/327, 413, 417, 418; 174/258; 523/446; 525/524
See application file for complete search history.

(56) References Cited

U.S. PATENT DOCUMENTS

| 4,393,195 | A  | * | 7/1983 | Gaku et al. | ................. 528/361 |
| 5,648,171 | A  | * | 7/1997 | von Gentzkow et al. | .... 428/413 |
| 6,214,455 | B1 | * | 4/2001 | Honda et al. | .............. 428/299.4 |
| 6,403,221 | B1 | * | 6/2002 | Nakamura et al. | ........... 428/416 |
| 6,447,915 | B1 | * | 9/2002 | Komiyatani et al. | ......... 428/416 |
| 7,368,497 | B2 | * | 5/2008 | Hosomi et al. | .............. 524/492 |

FOREIGN PATENT DOCUMENTS

| JP | 07-106767 | 4/1995 |
| JP | 2001-181375 | 7/2001 |
| JP | 2002-285015 | 10/2002 |
| JP | 2003-213019 | 7/2003 |
| JP | 2003-253018 | 9/2003 |
| JP | 2003-268136 | 9/2003 |
| JP | 2004-026980 | 1/2004 |
| JP | 2004-359853 | 12/2004 |
| WO | WO/03/018675 A1 | 3/2003 |

* cited by examiner

*Primary Examiner*—Cathy Lam
(74) *Attorney, Agent, or Firm*—Smith, Gambrell & Russell

(57) ABSTRACT

A multiple-layered printed wiring board is manufactured, which exhibits higher thermal resistance and lower thermal expansion so that no flaking and/or no crack would be occurred in a thermal shock test such as a cooling-heating cycle test and the like, in addition to exhibiting a fire retardancy. The resin composition is capable of being employed for forming a resin layer of a resin-attached metal foil or an insulating sheet of a base material-attached insulating sheet, and includes: a cyanate resin and/or a prepolymer thereof; an epoxy resin substantially containing no halogen atom; a phenoxy resin substantially containing no halogen atom; an imidazole compound; and an inorganic filler, and also directed to a resin-attached metal foil formed by cladding a metal foil with such resin composition, a base material-attached insulating sheet formed by cladding an insulating base material therewith, and a multiple-layered printed wiring board, formed by laying such resin-attached metal foil(s) or such base material-attached insulating sheet(s) on a single side or both sides of an internal layer circuit board, and hot pressure forming thereof.

12 Claims, No Drawings

RESIN COMPOSITION, RESIN-ATTACHED METAL FOIL, BASE MATERIAL-ATTACHED INSULATING SHEET AND MULTIPLE-LAYERED PRINTED WIRING BOARD

TECHNICAL FIELD

The present invention relates to a resin composition, a resin-attached metal foil, a base material-attached insulating sheet, and a multiple-layered printed wiring board.

BACKGROUND ART

In recent years, under circumstances of an increasing requirements for achieving enhanced performances of electronic equipments, a high-density integration of electronic components and further a high-density assembly of electronic components are progressed, and thus miniaturization and high-density assembly of circuit boards adopted for high density assembly application employed for the above-described electronic equipments are progressed than ever before. As solutions to the high-density assembly of such circuit board or the like, a buildup multiple-layered wiring board is often adopted (see, for example, Japanese Patent Laid-Open No. H07-106,767 (1995)).

A general buildup wiring board is formed by piling up an insulating layer composed of only a resin and having a thickness of equal to or less than 100 μm and a conductor circuit. In addition, typical method for providing joints between layers may include a laser process, a photo process and the like, in place of conventional drilling processes. These processes achieves a high-density assembly by disposing via holes having smaller diameters without any restriction, and various types of interlayer insulating materials for the buildup, which correspond to respective processes, are proposed.

Nevertheless, since the joints between the layers are provided by the fine vias in the process for forming the buildup multiple-layered interconnect board, a strength of the joint is lower, and according to the circumstances, when a thermal shock is experienced, problems such as generations of a crack and/or a disconnection due to a stress created by a difference in thermal expansion between an insulating resin and copper are occurred.

Further, a fire retardancy is often required for the applications for such buildup multiple-layered interconnect boards. Conventionally, in order to provide a fire retardancy to an epoxy resin, it is general to employ a halogen-containing fire retardant agent such as brominated epoxy and the like. However, since there is a fear that dioxin is generated from halogen-containing compounds, a use of a halogen-containing fire retardant agent is avoided under a circumstance of an intensified environmental problem in these days, and a halogen-free fire retardant system is broadly required in the industry.

[Patent Literature 1]

Japanese Patent Laid-Open No. H07-106,767 (1995)

DISCLOSURE OF THE INVENTION

The present invention provides: a resin composition that is capable of being employed for manufacturing a multiple-layered printed wiring board, which exhibits higher thermal resistance and lower thermal expansion so that no flaking and/or no crack would be occurred in a thermal shock test such as a cooling-heating cycle test and the like, in addition to exhibiting a fire retardancy, and also provides: a resin-attached metal foil; a base material-attached insulating sheet; and a multiple-layered printed wiring board, all of which employ the above-described resin.

Such objects can be achieved by configurations according to the present invention described in (1) to (9):

(1) A resin composition, capable of being employed for forming a resin layer of a resin-attached metal foil, comprising: a cyanate resin and/or a prepolymer thereof; an epoxy resin substantially containing no halogen atom; a phenoxy resin substantially containing no halogen atom; an imidazole compound; and an inorganic filler;

(2) A resin composition, capable of being employed for forming an insulating sheet of a base material-attached insulating sheet, comprising: a cyanate resin and/or a prepolymer thereof; an epoxy resin substantially containing no halogen atom; a phenoxy resin substantially containing no halogen atom; an imidazole compound; and an inorganic filler;

(3) The resin composition according to the above-described (1) or (2), wherein the above-described cyanate resin is a novolac cyanate resin;

(4) The resin composition according to any one of the above-described (1) to (3), wherein the above-described epoxy resin is an aryl alkylene epoxy resin;

(5) The resin composition according to any one of the above-described (1) to (4), wherein the above-described imidazole compound has two or more functional groups selected from a group consisting of aliphatic hydrocarbon group, aromatic hydrocarbon group, hydroxyalkyl group and cyanoalkyl group;

(6) A resin-attached metal foil, formed by cladding a metal foil with the resin composition according to any one of the above-described (1) to (5);

(7) A multiple-layered printed wiring board, formed by laying the resin-attached metal foil(s) according to the above-described (6) on a single side or both sides of an internal layer circuit board, and hot pressure forming thereof;

(8) A base material-attached insulating sheet, formed by cladding an insulating base material with the resin composition according to any one of the above-described (1) to (5); and (9) A multiple-layered printed wiring board, formed by laying the base material-attached insulating sheet(s) according to the above-described (8) on a single side or both sides of an internal layer circuit board, and hot pressure forming thereof.

The present invention relates to a resin composition comprising: a cyanate resin and/or a prepolymer thereof; an epoxy resin substantially containing no halogen atom; a phenoxy resin substantially containing no halogen atom; an imidazole compound; and an inorganic filler, and also relates to a resin-attached metal foil, a base material-attached insulating sheet and a multiple-layered printed wiring board, all of which employ the resin composition described above, and the present invention is capable of providing a manufacture of a multiple-layered printed wiring board, which exhibits an improved fire retardancy without a need for employing any halogen compound, and which also exhibits higher thermal resistance and lower thermal expansion so that no flaking and/or no crack would be occurred in a thermal shock test such as a cooling-heating cycle test.

BEST MODE FOR CARRYING OUT THE INVENTION

Embodiments concerning resin compositions, resin-attached metal foils, base material-attached insulating sheets and multiple-layered printed wiring boards according to the present invention will be fully described as follows.

A resin composition according to an aspect of the present embodiment is capable of being employed for forming a resin layer of a resin-attached metal foil, and comprises: a cyanate resin and/or a prepolymer thereof; an epoxy resin substantially containing no halogen atom; a phenoxy resin substantially containing no halogen atom; an imidazole compound; and an inorganic filler.

In addition, a resin composition according to another aspect of the present embodiment is capable of being employed for forming an insulating sheet of a base material-attached insulating sheet, and comprises: a cyanate resin and/or a prepolymer thereof; an epoxy resin substantially containing no halogen atom; a phenoxy resin substantially containing no halogen atom; an imidazole compound; and an inorganic filler.

In addition, a resin-attached metal foil according to the present embodiment is formed by cladding a metal foil with the resin compositions according to the above-described aspects of the present embodiment.

In addition, a base material-attached insulating sheet according to the present embodiment is formed by cladding an insulating base material with the resin compositions according to the above-described aspects of the present embodiment.

In addition, a multiple-layered printed wiring board according to the present embodiment is formed by laying the resin-attached metal foil(s) according to the above-described aspect of the present embodiment on a single side or both sides of an internal layer circuit board, and hot pressure forming thereof.

And, a multiple-layered printed wiring board according to the present embodiment is formed by laying the base material-attached insulating sheet(s) according to the above-described aspect of the present embodiment on a single side or both sides of an internal layer circuit board, and hot pressure forming thereof.

First of all, resin compositions according to the present embodiment will be described.

The resin composition according to the present embodiment contains a cyanate resin and/or a prepolymer thereof. This can provide an improved fire retardancy.

While a method for obtaining a cyanate resin and/or a prepolymer thereof is not particularly limited, these may be obtained by, for example, reacting a halogenated cyanide compound with phenols, and then pre-polymerizing the reacted compound as required, via a process such as a heating process and the like. In addition, a commercially available compound which is produced in such method may also be employed.

While a type of cyanate resin available in the present invention is not particularly limited, typical examples may include, for example, bisphenol cyanate resins such as a novolac cyanate resin, a bisphenol A cyanate resin, a bisphenol E cyanate resin, a tetramethyl bisphenol F cyanate resin and the like.

Among these resins, novolac cyanate resin is preferable. This can provide an increased cross linking density, so that an improve thermal resistance would be achieved, and a further improved fire retardancy would be achieved. It is considered this is because a novolac cyanate resin contains benzene ring at higher ratio in its structure, and thus is easy to be carbonized.

In addition to the above, a novolac cyanate resin may also be obtained by reacting, for example, a novolac phenolic resin with a compound such as cyanogen chloride, cyanogen bromide and the like. In addition, a commercially available compound which is produced in such process may also be employed.

Here, a compound represented by the following general formula (I), for example, may be employed as a novolac cyanate resin;

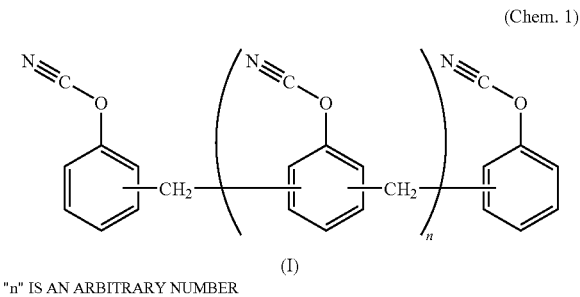

(Chem. 1)

(I)

"n" IS AN ARBITRARY NUMBER

While a weight-average molecular weight of the novolac cyanate resin presented by the above-described general formula (I) is not particularly limited, a weight-average molecular weight thereof may be 500 to 4,500, and preferably 600 to 3,000.

Excessively smaller weight-average molecular weight may cause a decreased mechanical strength of the obtained resin, and on the other hand, excessively larger weight-average molecular weight may cause an increased cure rate of the resin composition, leading to a reduced shelf life thereof, and thus the weight-average molecular weight thereof within the range as described above is provided, so that the obtained resin composition would exhibit well-balanced nature in terms of the both properties.

In addition to the above, a pre-polymerized compound of the above-described cyanate resin may also be employed as the above-described cyanate resin. More specifically, a cyanate resin may be employed alone, or various types of cyanate resins having different weight-average molecular weights may be jointly employed, or a cyanate resin and a prepolymer thereof may also be jointly employed.

Here, the prepolymer may ordinarily be obtained by, for example, trimerizing the above-described cyanate resin via a thermal reaction or the like, and may be preferably employed for providing a suitable formability or a suitable flowability of the resin composition.

Here, while a type of prepolymer available in the present invention is not particularly limited, typical examples may include, for example, a prepolymer having a trimerization ratio of 20 to 50% wt. This trimerization ratio may be obtained by employing, for example, an infrared spectrophotometer.

While content of the above-described cyanate resin in the resin composition of the present embodiment is not particularly limited, a content of the cyanate resin may be 5 to 50% wt. of the whole resin composition, and preferably 10 to 40% wt, in view of effectively exhibiting the above-described characteristics that the cyanate resin has.

Here, excessively smaller content of the cyanate resin may cause a decreased advantageous effect of higher thermal resistance provided by the cyanate resin, and on the other hand, excessively larger content of the cyanate resin provides an increased cross linking density to present an increased free volume, leading to a reduced moisture resistance thereof. Thus, content of the cyanate resin within the range as described above is provided, so that the advantageous effect obtained by employing the cyanate resin would exhibit well-balanced nature in terms of the both properties.

In the resin composition of the present embodiment, an epoxy resin containing substantially no halogen atom is employed. This can provide an improved thermal resistance and an improved thermal decomposition resistance, and an improved deposit-ability in the process for manufacturing a resin-attached copper foil or a base material-attached insulating sheet or an improved adhesiveness to an internal layer circuit board in the process for manufacturing a multiple-layered printed wiring board can be presented. Here, "containing substantially no halogen atom" indicates, for example, a compound having a content of halogen atom in the epoxy resin is equal to or lower than 1% wt.

While a type of the epoxy resin employed in the resin composition of the present embodiment is not particularly limited, typical epoxy resins may include, for example, a phenolic novolac epoxy resin, a bisphenol epoxy resin, a naphthalene epoxy resin, an aryl alkylene epoxy resin and the like. Among these, an aryl alkylene epoxy resin is preferable. This can provide an improved fire retardancy and an improved solder heat resistance after humidification.

Here, "aryl alkylene epoxy resin" means an epoxy resin having one or more aryl alkylene group in a constitutional repeating unit, and typically represented by, for example, a xylylene epoxy resin, a biphenyl dimethylene epoxy resin and the like. Among these, a biphenyl dimethylene epoxy resin may be a preferable choice. Typical biphenyl dimethylene epoxy resins may include, for example, a compound presented by the following general formula (II):

Excessively smaller weight-average molecular weight of the epoxy resin may cause a tackiness in a resin-attached metal foil and/or a base material-attached insulating sheet, which is formed by employing the obtained resin composition, and on the other hand, excessively larger weight-average molecular weight may cause a reduced solder heat resistance. Therefore, the advantageous effect obtained by employing the epoxy resin would exhibit well-balanced nature in terms of the both properties, when weight-average molecular weight of the epoxy resin is provided within the ranges described above.

While a content of the above-described epoxy resin is not particularly limited, a preferable content may be within a range of from 5 to 50% wt. of the whole resin composition. More preferably, a content may be within a range of from 10 to 40% wt. Excessively lower content of the epoxy resin may cause a reduced advantageous effects for providing an improved solder heat resistance after humidification and an improved adhesiveness presented by the epoxy resin, and on the other hand, excessively larger content may cause a relatively reduced content of the cyanate resin, so that the effect for providing the lower thermal expansion to the obtained resin composition is reduced. Therefore, the advantageous effect obtained by employing the epoxy resin would exhibit well-balanced nature in terms of the both properties, when the content of the epoxy resin is provided within the ranges described above.

The resin composition of the present embodiment contains the phenoxy resin containing substantially no halogen atom. This can provide an improved deposit-ability in the process for manufacturing a resin-attached metal foil or a base mate-

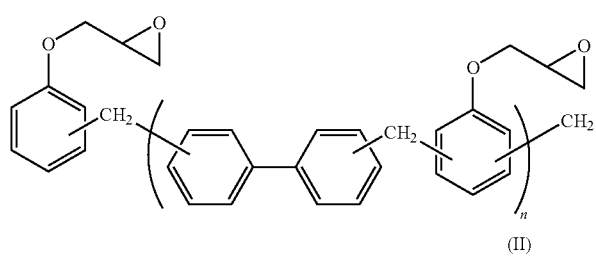

(Chem. 2)

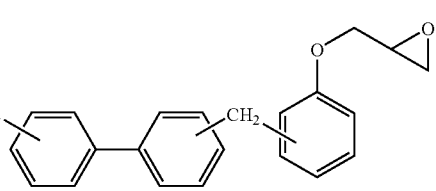

(II)

"n" IS AN ARBITRARY NUMBER

"n" of biphenyl dimethylene epoxy resin presented by the above-described general formula (II) may be within a range of from 1 to 10, and preferably within a range of from 2 to 5. Excessively smaller "n" may easily cause a crystallization of biphenyl dimethylene epoxy resin, such that a solubility for general-purpose solvents is relatively reduced, becoming difficult to handle thereof, and on the other hand, excessively larger "n" may cause a reduced flowability of the resin, possibly causing a failure in the molding process, and therefore, the advantageous effect obtained by employing the biphenyl dimethylene epoxy resin would exhibit well-balanced nature in terms of the both properties, when "n" is provided within the ranges described above.

Weight-average molecular weight of the above-described epoxy resin may be preferably equal to or lower than 4,000, although it is not particularly limited. It may further preferably be within a range of from 500 to 4,000, and may particularly preferably be within a range of from 800 to 3,000.

rial-attached insulating sheet. Here, "containing substantially no halogen atom" means a status that a phenoxy resin, for example, contains halogen atom at a content of equal to or lower than 1% wt.

While a type of the above-described phenoxy resin is not particularly limited, typical phenoxy resins may include, for example, a phenoxy resin having bisphenol backbone, a phenoxy resin having novolac backbone, a phenoxy resin having naphthalene backbone, a phenoxy resin having biphenyl backbone or the like. In addition, a phenoxy resin having a structure having two or more of these backbones may also be employed.

Among these, a compound having biphenyl backbone and bisphenol S backbone may be employed. This can provide an increased glass-transition temperature due to an inflexibility that biphenyl backbone has, and can also provide an improved adhesiveness of a plated metal due to bisphenol S backbone, during the process for manufacturing the multiple-layered printed wiring board.

In addition, a compound having bisphenol A backbone and bisphenol F backbone may be employed. This can provide an improved adhesiveness to the internal layer circuit board during the process for manufacturing the multiple-layered printed wiring board.

In addition, the above-described compound having biphenyl backbone and bisphenol S backbone and the compound having bisphenol A backbone and bisphenol F backbone may also be jointly employed. Having such formulation, these characteristics can be exhibited in a balanced manner.

When (1) the above-described compound having bisphenol A backbone and bisphenol F backbone and (2) the compound having biphenyl backbone and bisphenol S backbone are jointly employed, a ratio of the joint use is not particularly limited, but may be, for example, (1):(2)=2:8 to 9:1.

While a molecular weight of the phenoxy resin is not particularly limited, a compound having a weight-average molecular weight within a range of from 5000 to 70,000 may be employed, and it is preferable to employ a compound having a weight-average molecular weight within a range of from 5,000 to 50,000. More preferably, a weight-average molecular weight may be within a range of from 10,000 to 40,000.

Excessively smaller weight-average molecular weight of the phenoxy resin may cause a reduced advantageous effects for providing an improved deposit-ability due to the presence of the phenoxy resin, and on the other hand, excessively larger weight-average molecular weight may cause a reduced solubility of the phenoxy resin, and therefore, the advantageous effect obtained by employing the phenoxy resin would exhibit well-balanced nature in terms of the both properties, when the weight-average molecular weight of the phenoxy resin is within the ranges described above.

While a content of the phenoxy resin is not particularly limited, the preferable content may be within a range of from 1 to 40% wt. of the whole resin composition.

More preferably, the content may be within a range of from 5 to 30% wt. Excessively lower content of the phenoxy resin may cause a reduced advantageous effects for providing an improved deposit-ability due to the presence of the phenoxy resin, and on the other hand, excessively larger content may cause a relatively reduced content of the cyanate resin, so that the effect for providing the lower thermal expansion to the obtained resin composition is reduced, and therefore, the advantageous effect obtained by employing the phenoxy resin would exhibit well-balanced nature in terms of the both properties, when the content of the phenoxy resin is within the ranges described above.

The resin composition of the present embodiment contains an imidazole compound as a curing agent. This can achieve an acceleration of reactions of the cyanate resin and the epoxy resin, without deteriorating the insulating performance of the resin composition.

While a type of the imidazole compound is not particularly limited, typical imidazole compounds may include, for example: 2-phenyl-4-methyl imidazole; 2-phenyl-4-methyl-5-hydroxymethyl imidazole; 2-phenyl-4,5-dihydroxymethyl imidazole; 2,4-diamino-6-[2'-methyl imidazolyl-(1')]-ethyl-s-triazine; 2,4-diamino-6-(2'-undecyl imidazolyl)-ethyl-s-triazine; 2,4-diamino-6-[2'-ethyl-4-methyl imidazolyl-(1')]-ethyl-s-triazine; 1-benzil-2-phenylimidazole or the like.

Among these, an imidazole compound having two or more functional groups selected from a group consisting of aliphatic hydrocarbon group, aromatic hydrocarbon group, hydroxyalkyl group and cyano alkyl group is preferable, and in particular, 2-phenyl-4,5-dihydroxymethyl imidazole is preferable. A use of such imidazole compound provides an improved thermal resistance of the resin composition, and a reduced thermal expansion and a reduced water absorption can be provided to a resin layer formed of this resin composition.

While a content of the above-described imidazole compound is not particularly limited, a preferable content may be within a range of from 0.05 to 5% wt. of the combination of the above-described cyanate resin and the epoxy resin, and preferably from 0.1 to 5% wt., and more preferably from 0.1 to 3% wt. This particularly provides an improved thermal resistance of the resin composition.

The resin composition of the present embodiment contains an inorganic filler. This can provide a reduced thermal expansion and an improved fire retardancy. In addition, a combination of the above-described cyanate resin and/or a prepolymer (in particular, novolac cyanate resin) with an inorganic filler can provide an improved elastic modulus.

While a type of the above-described inorganic filler is not particularly limited, typical inorganic fillers may include, for example, talc, alumina, glass, silica, mica and the like. Among these, silica is a preferable choice, and in particular, fused silica is preferable, in terms of providing an improved lower expansion.

Typical shape of the fused silica includes a crushed shape and a spherical shape, and spherical-shaped product is preferable. A use of fused silica having such particle shape provides a larger loading ability of the filler in the resin composition, and even in such larger filler loading, an improved flowability can still be provided.

While mean particle diameter of the above-described inorganic filler is not particularly limited, it is preferable to be within a range of from 0.01 to 5 μm. More preferably, the diameter may be within a range of from 0.2 to 2 μm.

Excessively smaller mean particle diameter of the inorganic filler may cause an increased viscosity of a resin varnish when the resin varnish is prepared by employing the resin composition of the present embodiment, so that a workability for manufacturing the resin-attached metal foil or the base material-attached insulating sheet would be adversely affected, and on the other hand, excessively larger diameter may cause a phenomenon such as a sedimentation of the inorganic filler in the resin varnish, and therefore, the advantageous effect obtained by employing the inorganic filler would exhibit well-balanced nature in terms of the both properties, when the mean particle diameter of the inorganic filler is provided within the ranges described above.

While a content of the above-described inorganic filler is not particularly limited, the preferable content may be within a range of from 20 to 70% wt. in the whole resin composition. More preferably, the content may be within a range of from 30 to 60% wt.

Excessively lower content of the inorganic filler may cause a reduced effect for providing the lower thermal expansion and lower water absorption by the presence of the inorganic filler, and on the other hand, excessively larger content may cause a decreased flowability of the resin composition, leading to a reduced formability, and therefore, the advantageous effect obtained by employing the inorganic filler would exhibit well-balanced nature in terms of the both properties, when the content of the inorganic filler is provided within the ranges described above.

The resin composition of the present embodiment may further contain a coupling agent. A use of the coupling agent can provide an improved wettability at an interface between the resin and the inorganic filler, so that a thermal resistance, and in particular a solder heat resistance after humidification, can be improved.

While a type of the above-described coupling agent is not particularly limited, one or more coupling agent(s) selected from a group consisting of an epoxysilane coupling agent, a titanate-containing coupling agent, an aminosilane coupling agent and a silicone oil-containing coupling agent may be preferably employed. This can provide a particularly improved wettability at the interface between the resin and the inorganic filler, so that a thermal resistance would be improved.

While a content of the above-described coupling agent is not particularly limited, the preferable content may be within a range of from 0.05 to 3 part(s) by weight (hereinafter abbreviated by "PBW") over 100 PBW of the inorganic filler.

Excessively lower content may cause a tendency of causing an insufficient effect for providing an improved thermal resistance obtained by coating the inorganic filler therewith, and on the other hand, excessively larger content may cause a tendency of reducing the flexural strength of the resin-attached metal foil or the base material-attached insulating sheet, and therefore, the advantageous effect obtained by employing the coupling agent would exhibit well-balanced nature in terms of the both properties, when the content of the coupling agent is provided within the ranges described above.

The resin composition of the present embodiment may additionally contain other type of additive such as an antifoaming agent, a leveling agent and the like as required, in addition to the components described above.

Next, the resin-attached metal foil of the present embodiment will be described.

The resin-attached metal foil of the present embodiment is formed by cladding a metal foil with the resin compositions of the present embodiment described above. While a process for cladding the metal foil with the resin composition is not particularly limited here, a typical process may be, for example: a process for dissolving and dispersing the resin composition with a solvent to prepare a resin varnish, and coating thereof on the metal foil, and then drying the coated foil; or a process for coating the resin varnish on a base material, and then drying the coated material to produce a resin composition film formed of the resin composition, and then adhering the produced film on a metal foil.

Among these, the process for coating the resin varnish on the metal foil and then drying the coated foil is preferable. Having such procedure, a void-free resin-attached metal foil having a uniform resin layer thickness distribution can be simply obtained.

Organic solvents such as, for example, alcohols, ethers, acetals, ketones, esters, alcohol esters, ketone alcohols, ether alcohols, ketone ethers, ketone esters, ester ethers and the like, can be employed for preparing the above-described resin varnish.

While a solid content in the above-described resin varnish is not particularly limited, a preferable content may be within a range of from 30 to 80% wt., and a particularly preferable content may be within a range of from 40 to 70% wt. Having the solid content in the resin varnish within such range, an improved deposit-ability and an improved workability can be achieved, and a resin-attached metal foil having highly uniform resin layer thickness can be obtained.

While the thickness of the resin layer composed of the above-described resin composition is not particularly limited in the resin-attached metal foil of the present embodiment, the preferable thickness may be within a range of from 10 to 100 μm. More preferably, the thickness may be within a range of from 20 to 80 μm. When the resin film is formed to have such thickness, concavity and convexity of the internal layer circuit can be filled in the forming process in a manufacture of a multiple-layered printed wiring board employing this resin-attached metal foil, and a preferable thickness of the insulating layer can be assured. In addition, in the resin-attached metal foil, a generation of a crack in the resin layer formed of the resin composition can be inhibited, and scum generated in the cutting process can be reduced.

While a type of a metal composing the metal foil employed for the resin-attached metal foil of the present embodiment is not particularly limited, typical metals include, for example, copper and/or copper-containing alloy, aluminum and/or aluminum-containing alloy, iron and/or iron-containing alloy or the like.

Next, a multiple-layered printed wiring board of the present embodiment will be described.

A multiple-layered printed circuit board of the present embodiment is formed by laying the above-described resin-attached metal foil(s) on a single side or both sides of an internal layer circuit board, and conducting a hot pressure forming thereof. More specifically, the above-described resin-attached metal foil(s) is laid on a single side or both sides of an internal layer circuit board, and then a hot pressure forming process is conducted by employing a flat plate pressing apparatus to obtain the product.

While available conditions for the hot pressure forming process is not particularly limited, typical conditions may be at a temperature within a range of from 140 to 240 degree C. and a pressure within a range of from 1 to 4 MPa.

In addition, a preferable internal layer circuit board employed for obtaining the multiple-layered printed wiring board may be manufactured by, for example, a process, in which predetermined conductor circuits are formed on both sides of a copper-clad multiple-layered plate via an etch process or the like, and portions of the conductor circuit are blackened.

Next, a base material-attached insulating sheet of the present embodiment will be described.

A base material-attached insulating sheet of the present embodiment is formed by cladding an insulating base material with the above-described resin composition of the present embodiment, and is composed of an insulating sheet formed of a resin composition and an insulating base material supporting thereof.

While a process for cladding the insulating base material with the resin composition is not particularly limited, a typical process may be, for example: a process for dissolving and dispersing the resin composition with a solvent to prepare a resin varnish, and applying it on the insulating base material with an appropriate type of coating machine, and then drying the applied material; or a process for spray-coating the insulating base material with the resin varnish by employing a spraying apparatus, and then drying the coated material.

Among these, the process for coating the resin varnish on the insulating base material with an appropriate type of coating machine such as a comma bar coater, a die coater and the like and then drying the coated material is preferable. Having such procedure, a void-free base material-attached insulating sheet having uniform thickness of the insulating sheet layer can be manufactured with an improved efficiency.

Organic solvents such as, for example, alcohols, ethers, acetals, ketones, esters, alcohol esters, ketone alcohols, ether alcohols, ketone ethers, ketone esters, ester ethers and the like, may be employed for preparing the above-described resin varnish.

While a solid content in the above-described resin varnish is not particularly limited, a preferable content may be within a range of from 30 to 80% wt., and a particularly preferable content may be within a range of from 40 to 70% wt.

Having the solid content in the resin varnish within such range, an improved deposit-ability and an improved workability can be achieved, and a base material-attached insulating sheet having uniform thickness of the insulating sheet layer can be obtained.

While a thickness of the insulating sheet layer composed of the resin composition is not particularly limited in the base material-attached insulating sheet of the present embodiment, a preferable thickness may be within a range of from 10 to 100 μm. More preferably, the thickness may be within a range of from 20 to 80 μm.

Having such thickness, the concavity and convexity of the internal layer circuit can be filled in the forming process in a manufacture of a multiple-layered printed wiring board employing this base material-attached insulating sheet, and a preferable thickness of the insulating layer can be assured. In addition, in the base material-attached insulating sheet, a generation of a crack in the insulating sheet layer can be inhibited, and scum generated in the cutting process can be reduced.

While a type of the insulating base material employed for the base material-attached insulating sheet of the present embodiment is not particularly limited, typical material may include, for example, a film of a thermoplastic resin having higher thermal resistance such as a fluorine-containing resin, a polyimide resin and the like, in addition to polyester resins such as polyethylene terephthalate, polybutylene terephthalate and the like.

While a thickness of the insulating base material is not particularly limited, a use of the material having a thickness within a range of from 10 to 70 μm provides an improved handle-ability in manufacturing the base material-attached insulating sheet, and thus preferable.

In addition to the above, when the base material-attached insulating sheet of the present embodiment is manufactured, unevenness in the surface of the insulating base member in the side of being joined to the insulating sheet is preferably as small as possible.

Next, a multiple-layered printed wiring board of the present embodiment employing a base material-attached insulating sheet will be described.

The above-described multiple-layered printed circuit board is formed by laying the above-described base material-attached insulating sheet(s) on a single side or both sides of an internal layer circuit board, and conducting a hot pressure forming thereof.

More specifically, a side of the insulating sheet layer of the base material-attached insulating sheet of the above-described present embodiment is fitted with the internal layer circuit board, and then, vacuum hot pressure forming of the fitted sheet is carried out by employing a vacuum pressure laminator apparatus, and then, the sheet is hot cured by employing a hot air drier or the like to obtain the finished product. While available conditions for the hot pressure forming process is not particularly limited, a typical conditions may be at a temperature within a range of from 60 to 160 degree C. and a pressure within a range of from 0.2 to 3 MPa. In addition, while available conditions for the hot cure process is not particularly limited, a typical condition may be at a temperature within a range of from 140 to 240 degree C. and for 30 to 120 minutes.

Alternatively, a side of the insulating sheet layer of the base material-attached insulating sheet of the above-described present embodiment is laid over the internal layer circuit board, and then the hot pressure forming of the obtained circuit board is carried out by employing a flat plate pressing apparatus or the like to obtain the finished product. While available conditions for the hot pressure forming process are not particularly limited, typical conditions may be at a temperature within a range of from 140 to 240 degree C. and a pressure within a range of from 1 to 4 MPa.

Concerning the multiple-layered printed wiring board obtained as described above, the insulating base material may be further stripped off and a circuit may be formed on the surface of the insulating sheet layer via a metal plating process, or substrates having metal foils and circuits formed thereon may be overlaid, and a hot pressure forming thereof may be conducted by employing a flat plate pressing apparatus.

In addition to the above, a preferable internal layer circuit board employed for obtaining the multiple-layered printed wiring board may be manufactured by, for example, a process, in which predetermined conductor circuits are formed on both sides of a copper-clad multiple-layered plate via an etch process or the like, and portions of the conductor circuit are blackened.

EXAMPLE

Examples illustrating the present invention will be described in detail as follows.

Raw materials employed in examples are as follows:

(1) Cyanate resin A/novolac cyanate resin: commercially available from Lonza under the trade name of "Primaset PT-30" and weight-average molecular weight of 700;

(2) Cyanate resin B/novolac cyanate resin: commercially available from Lonza under the trade name of "Primaset PT-60" and weight-average molecular weight of 2,600;

(3) Epoxy resin/biphenyl dimethylene epoxy resin: commercially available from Nippon Kayaku Co. Ltd., under the trade name of "NC-3000", weight per epoxy equivalent of 275 and weight-average molecular weight of 2,000;

(4) Phenoxy resin A/copolymer of biphenyl epoxy resin and bisphenol S epoxy resin, a terminal end thereof having epoxy functional group: commercially available from Japan Epoxy Resin company Co. Ltd., under the trade name of "YX-8100H30" and weight-average molecular weight of 30,000

(5) Phenoxy resin B/copolymer of bisphenol A epoxy resin and bisphenol F epoxy resin, a terminal end thereof having epoxy functional group: commercially available from Japan Epoxy Resin company Co. Ltd., under the trade name of "epicoat 4275" and weight-average molecular weight of 60,000;

(6) Curing catalyst/imidazole compound: commercially available from Shikoku Chemicals Co. Ltd., "2-phenyl-4,5-dihydroxymethyl imidazole";

(7) Inorganic filler/spherical fused silica: commercially available from Admatex Co. Ltd., under the trade name of "SO-25H" and mean particle diameter of 0.5 μm; and (8) Coupling agent/epoxysilane coupling agent: commercially available from Nippon Unicar Co. Ltd., under the trade name of "A-187".

Experimental Example A1

(1) Preparation of Resin Varnish 25 parts by weight (PBW) of cyanate resin A; 25 PBW of epoxy resin; 10 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using a high-speed stirrer to prepare a resin varnish with a solid content of 50% wt.

(2) Manufacture of Resin-Attached Metal Foil

The resin varnish obtained as described above was applied on an anchor surface of an electrolytic copper foil having a thickness of 18 μm (commercially available from Furukawa Circuit Foil Co. Ltd., under the trade name of "GTSMP-18") by employing a comma bar coater so as to have a resin layer thickness after a drying process of 60 μm, and then, the obtained product was dried for 10 minutes in a drier at 160 degree C. to obtain a resin-attached metal foil.

(3) Manufacture of Multiple-Layered Printed Wiring Board

The resin-attached metal foils obtained as described above were laid on a front and a back sides of an internal layer circuit board having a predetermined internal layer circuit formed on the both sides, so that a resin layer surface of the resin-attached metal foil was in the inner side thereof, and a hot pressure forming process of the obtained board was conducted by employing a vacuum pressing apparatus at a pressure of 2 MPa and a temperature of 200 degree C. for 2 hours, thereby obtaining a multiple-layered printed wiring board.

In addition to the above, following materials were employed for the internal layer circuit board:

Insulating layer: halogen free FR-4 member, having a thickness of 0.2 mm;

conductor layer: copper foil, having a thickness of 18 μm, L/S=120/180 μm, having clearance holes of 1 mmφ and 3 mmφ, and having a slit of 2 mm;

Experimental Example A2

15 PBW of cyanate resin A; 10 PBW of cyanate resin B; 25 PBW of epoxy resin; 10 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A3

40 PBW of cyanate resin A; 10 PBW of epoxy resin; 10 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A4

20 PBW of cyanate resin A; 30 PBW of epoxy resin; 10 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A5

30 PBW of cyanate resin A; 15 PBW of epoxy resin; 15 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A6

17 PBW of cyanate resin A; 17 PBW of epoxy resin; 6 PBW of phenoxy resin A; and 0.4 PBW of curing catalyst were dissolved and dispersed in methyl ethyl ketone. Further, 60 PBW of inorganic filler and 0.3 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A7

30 PBW of cyanate resin A; 10 PBW of cyanate resin B; 20 PBW of epoxy resin; 10 PBW of phenoxy resin A; and 0.4 PBW of curing catalyst were dissolved and dispersed in methyl ethyl ketone. Further, 30 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A8

50 PBW of cyanate resin A; 10 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A9

50 PBW of epoxy resin; 10 PBW of phenoxy resin A; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example A1.

Experimental Example A10

30 PBW of cyanate resin A; 10 PBW of cyanate resin B; 50 PBW of epoxy resin; 10 PBW of phenoxy resin A; and 0.8 PBW of curing catalyst were dissolved and dispersed in methyl ethyl ketone to prepare a resin varnish with a solid content of 50% wt.

This resin varnish was employed to obtain a resin-attached metal foil and a multiple-layered printed wiring board, similarly as in Experimental Example A1.

Experimental Example B1

(1) Preparation of Resin Varnish

25 PBW of cyanate resin A; 25 PBW of epoxy resin; 5 PBW of phenoxy resin A; 5 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using a high-speed stirrer to prepare a resin varnish with a solid content of 50% wt.

(2) Manufacture of Resin-Attached Metal Foil

The resin varnish obtained as described above was applied on an anchor surface of an electrolytic copper foil having a thickness of 18 μm (commercially available from Furukawa Circuit Foil Co. Ltd., under the trade name of "GTSMP-18") by employing a comma bar coater so as to have a resin layer thickness after a drying process of 60 μm, and then, the obtained product was dried for 10 minutes in a drier at 160 degree C. to obtain a resin-attached metal foil.

(3) Manufacture of Multiple-Layered Printed Wiring Board

The resin-attached metal foils obtained as described above were laid on a front and a back sides of an internal layer circuit board having a predetermined internal layer circuit formed on the both sides, so that a resin layer surface of the resin-attached metal foil was in the inner side thereof, and a hot pressure forming process of the obtained board was conducted by employing a vacuum pressing apparatus at a pressure of 2 MPa and a temperature of 200 degree C. for 2 hours, thereby obtaining a multiple-layered printed wiring board.

In addition to the above, the same materials as employed in Experimental Example A1 were employed for the internal layer circuit board here.

Experimental Example B2

15 PBW of cyanate resin A; 10 PBW of cyanate resin B; 25 PBW of epoxy resin; 5 PBW of phenoxy resin A; 5 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B3

40 PBW of cyanate resin A; 10 PBW of epoxy resin; 5 PBW of phenoxy resin A; 5 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B4

20 PBW of cyanate resin A; 30 PBW of epoxy resin; 5 PBW of phenoxy resin A; 5 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B5

30 PBW of cyanate resin A; 15 PBW of epoxy resin; 10 PBW of phenoxy resin A; 5 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B6

17 PBW of cyanate resin A; 17 PBW of epoxy resin; 3 PBW of phenoxy resin A; 3 PBW of phenoxy resin B; and 0.4 PBW of curing catalyst were dissolved and dispersed in methyl ethyl ketone. Further, 60 PBW of inorganic filler and 0.3 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B7

30 PBW of cyanate resin A; 10 PBW of cyanate resin B; 20 PBW of epoxy resin; 5 PBW of phenoxy resin A; 5 PBW of phenoxy resin B; and 0.4 PBW of curing catalyst were dissolved and dispersed in methyl ethyl ketone. Further, 30 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B8

50 PBW of cyanate resin A; 5 PBW of phenoxy resin A; 5 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B9

50 PBW of epoxy resin; 7 PBW of phenoxy resin A; 3 PBW of phenoxy resin B; and 0.4 PBW of curing catalyst were dissolved and dispersed in methyl ethyl ketone. Further, 40 PBW of inorganic filler and 0.2 PBW of coupling agent were added therein, and stirred for 10 minutes by using the high-speed stirrer to prepare a resin varnish with a solid content of 50% wt.

This resin varnish was employed to obtain a resin-attached metal foil and a multiple-layered printed wiring board, similarly as in Experimental Example B1.

Experimental Example B10

30 PBW of cyanate resin A; 10 PBW of cyanate resin B; 50 PBW of epoxy resin; 3 PBW of phenoxy resin A; 7 PBW of phenoxy resin B; and 0.8 PBW of curing catalyst were dissolved and dispersed in methyl ethyl ketone to prepare a resin varnish with a solid content of 50% wt.

This resin varnish was employed to obtain a resin-attached metal foil and a multiple-layered printed wiring board, similarly as in Experimental Example B1.

Experimental Example C1

(1) Preparation of Resin Varnish

A resin varnish with a solid content of 50% wt. was prepared, similarly as in Experimental Example A1.

(2) Manufacture of Base Material-Attached Insulating Sheet

The resin varnish obtained as described above was applied on one side of polyethylene terephthalate (PET) film having a thickness of 38 μm by employing a comma bar coater so as to have a thickness of the insulating film after a drying process of 60 μm, and then, the obtained product was dried in a drier at 160 degree C. for 10 minutes to obtain a base material-attached insulating sheet.

(3) Manufacture of Multiple-Layered Printed Wiring Board

The base material-attached insulating sheets obtained as described above were laid on a front and a back sides of an internal layer circuit board having a predetermined internal layer circuit formed on the both sides, so that an insulating sheet surface of the base material-attached insulating sheet was in the inner side thereof, and a vacuum hot pressure forming process of the obtained board was conducted by employing a vacuum pressure laminator apparatus at a pressure of 0.5 MPa and a temperature of 100 degree C. for 60 seconds, and then, the base material was stripped off, and then, a hot cure was conducted by employing a hot air drier at a temperature of 150 degree C. for 60 minutes. Thereafter, a copper plating process was conducted via a general additive process to obtain a multiple-layered printed wiring board.

In addition to the above, the same materials as employed in Experimental Example A1 were employed for the internal layer circuit board here.

Experimental Example C2

Similarly as in Experimental Example A2, a resin varnish with a solid content of 50% wt. was prepared.

This resin varnish was employed to obtain a base material-attached insulating sheet and a multiple-layered printed wiring board, similarly as in Experimental Example C1.

Experimental Example C3

Similarly as in Experimental Example A3, a resin varnish with a solid content of 50% wt. was prepared.

This resin varnish was employed to obtain a base material-attached insulating sheet and a multiple-layered printed wiring board, similarly as in Experimental Example C1.

Experimental Example C4

Similarly as in Experimental Example A4, a resin varnish with a solid content of 50% wt. was prepared.

This resin varnish was employed to obtain a base material-attached insulating sheet and a multiple-layered printed wiring board, similarly as in Experimental Example C1.

Experimental Example C5

Similarly as in Experimental Example A5, a resin varnish with a solid content of 50% wt. was prepared.

This resin varnish was employed to obtain a base material-attached insulating sheet and a multiple-layered printed wiring board, similarly as in Experimental Example C1.

Experimental Example C6

Similarly as in Experimental Example A6, a resin varnish with a solid content of 50% wt. was prepared.

This resin varnish was employed to obtain a base material-attached insulating sheet and a multiple-layered printed wiring board, similarly as in Experimental Example C1.

Experimental Example C7

Similarly as in Experimental Example A7, a resin varnish with a solid content of 50% wt. was prepared.

This resin varnish was employed to obtain a base material-attached insulating sheet and a multiple-layered printed wiring board, similarly as in Experimental Example C1.

Experimental Example C8

Similarly as in Experimental Example A8, a resin varnish with a solid content of 50% wt. was prepared.

This resin varnish was employed to obtain a base material-attached insulating sheet and a multiple-layered printed wiring board, similarly as in Experimental Example C1.

Experimental Example C9

Similarly as in Experimental Example A9, a resin varnish with a solid content of 50% wt. was prepared.

This resin varnish was employed to obtain a base material-attached insulating sheet and a multiple-layered printed wiring board, similarly as in Experimental Example C1.

Experimental Example C10

Similarly as in Experimental Example A10, a resin varnish with a solid content of 50% wt. was prepared.

This resin varnish was employed to obtain a base material-attached insulating sheet and a multiple-layered printed wiring board, similarly as in Experimental Example C1.

Experimental Example D1

(1) Preparation of Resin Varnish
Similarly as in Experimental Example B1, a resin varnish with a solid content of 50% wt. was prepared.

(2) Manufacture of Base Material-Attached Insulating Film
The resin varnish obtained as described above was applied on one side of polyethylene terephthalate (PET) film having a thickness of 38 µm by employing a comma bar coater so as to have a thickness of the insulating film after a drying process of 60 µm, and then, the obtained product was dried in a drier at 160 degree C. for 10 minutes to obtain a base material-attached insulating sheet.

(3) Manufacture of Multiple-Layered Printed Wiring Board
The base material-attached insulating sheets obtained as described above were laid on a front and a back sides of an internal layer circuit board having a predetermined internal layer circuit formed on the both sides, so that an insulating sheet surface of the base material-attached insulating sheet was in the inner side thereof, and a vacuum hot pressure forming process of the obtained board was conducted by employing a vacuum pressure laminator apparatus at a pressure of 0.5 MPa and a temperature of 100 degree C. for 60 seconds, and then, the base material was stripped off, and then, a hot cure was conducted by employing a hot air drier at a temperature of 150 degree C. for 60 minutes. Thereafter, a copper plating was conducted via a general additive process to obtain a multiple-layered printed wiring board.

In addition to the above, the same materials as employed in Experimental Example A1 were employed for the internal layer circuit board here.

Experimental Example D2

Similarly as in Experimental Example B2, a resin varnish with a solid content of 50% wt. was prepared.
This resin varnish was employed to obtain a base material-attached insulating sheet and a multiple-layered printed wiring board, similarly as in Experimental Example D1.

Experimental Example D3

Similarly as in Experimental Example B3, a resin varnish with a solid content of 50% wt. was prepared.
This resin varnish was employed to obtain a base material-attached insulating sheet and a multiple-layered printed wiring board, similarly as in Experimental Example D1.

Experimental Example D4

Similarly as in Experimental Example B4, a resin varnish with a solid content of 50% wt. was prepared.
This resin varnish was employed to obtain a base material-attached insulating sheet and a multiple-layered printed wiring board, similarly as in Experimental Example D1.

Experimental Example D5

Similarly as in Experimental Example B5, a resin varnish with a solid content of 50% wt. was prepared.
This resin varnish was employed to obtain a base material-attached insulating sheet and a multiple-layered printed wiring board, similarly as in Experimental Example D1.

Experimental Example D6

Similarly as in Experimental Example B6, a resin varnish with a solid content of 50% wt. was prepared.
This resin varnish was employed to obtain a base material-attached insulating sheet and a multiple-layered printed wiring board, similarly as in Experimental Example D1.

Experimental Example D7

Similarly as in Experimental Example B7, a resin varnish with a solid content of 50% wt. was prepared.
This resin varnish was employed to obtain a base material-attached insulating sheet and a multiple-layered printed wiring board, similarly as in Experimental Example D1.

Experimental Example D8

Similarly as in Experimental Example B8, a resin varnish with a solid content of 50% wt. was prepared.
This resin varnish was employed to obtain a base material-attached insulating sheet and a multiple-layered printed wiring board, similarly as in Experimental Example D1.

Experimental Example D9

Similarly as in Experimental Example B9, a resin varnish with a solid content of 50% wt. was prepared.
This resin varnish was employed to obtain a base material-attached insulating sheet and a multiple-layered printed wiring board, similarly as in Experimental Example D1.

Experimental Example D10

Similarly as in Experimental Example B10, a resin varnish with a solid content of 50% wt. was prepared.
This resin varnish was employed to obtain a base material-attached insulating sheet and a multiple-layered printed wiring board, similarly as in Experimental Example D1.

Evaluations of properties were carried out for the resin-attached metal foils, the base material-attached insulating sheets and the multiple-layered printed wiring boards obtained in respective examples. Results are shown in Tables 1 to 4.

TABLE 1

| | | | EX. A1 | EX. A2 | EX. A3 | EX. A4 | EX. A5 | EX. A6 | EX. A7 | EX. A8 | EX. A9 | EX. A10 |
|---|---|---|---|---|---|---|---|---|---|---|---|---|
| FORMULA-TION OF RESIN COMPO-SITION | CYANATE RESIN | PRIMASET PT-30 | 25 | 15 | 40 | 20 | 30 | 17 | 30 | 50 | | 30 |
| | | PRIMASET PT-60 | | 10 | | | | | 10 | | | 10 |
| | EPOXY RESIN | NC-3000P | 25 | 25 | 10 | 30 | 15 | 17 | 20 | | 50 | 50 |

TABLE 1-continued

|  |  |  | EX. A1 | EX. A2 | EX. A3 | EX. A4 | EX. A5 | EX. A6 | EX. A7 | EX. A8 | EX. A9 | EX. A10 |
|---|---|---|---|---|---|---|---|---|---|---|---|---|
|  | PHENOXY RESIN | YX-8100H30 | 10 | 10 | 10 | 10 | 15 | 6 | 10 | 10 | 10 | 10 |
|  | CURING CATALYST | IMIDAZOLE COMPOUND | 0.4 | 0.4 | 0.4 | 0.4 | 0.4 | 0.4 | 0.4 | 0.4 | 0.4 | 0.8 |
|  | INORGANIC FILLER | SO-25H | 40 | 40 | 40 | 40 | 40 | 60 | 30 | 40 | 40 |  |
|  | COUPLING AGENT | A-187 | 0.2 | 0.2 | 0.2 | 0.2 | 0.2 | 0.3 | 0.2 | 0.2 | 0.2 |  |
|  | TOTAL |  | 100.6 | 100.6 | 100.6 | 100.6 | 100.6 | 100.7 | 100.6 | 100.6 | 100.6 | 100.8 |
| EVALUATION (RESIN-ATTACHED METAL FOIL) | GRASS TRANSITION TEMPERATURE | DMA (° C.) | 250 | 250 | 270 | 230 | 260 | 250 | 250 | 300 | 180 | 230 |
|  | LINEAR EXPANSION COEFFICIENT | TMA (ppm) | 30 | 30 | 25 | 33 | 35 | 20 | 38 | 23 | 40 | 45 |
| EVALUATION (MULTIPLE-LAYERED PRINTED WIRING BOARD) | FIRE RETARDANCY | UL-94 | V-0 | V-0 | V-0 | V-0 | V-0 | V-0 | V-0 | V-0 | V-1 | V-1 |
|  | FORMABILITY | PRESENCE OF VOIDS | OK | OK | OK | OK | OK | OK | OK | OK | OK | OK |
|  | SOLDER HEAT RESISTANCE AFTER HUMIDIFICATION | BLISTER/FLAKING | OK | OK | OK | OK | OK | OK | OK | NG | OK | OK |

TABLE 2

|  |  |  | EX. B1 | EX. B2 | EX. B3 | EX. B4 | EX. B5 | EX. B6 | EX. B7 | EX. B8 | EX. B9 | EX. B10 |
|---|---|---|---|---|---|---|---|---|---|---|---|---|
| FORMULATION OF RESIN COMPOSITION | CYANATE RESIN | PRIMASET PT-30 | 25 | 15 | 40 | 20 | 30 | 17 | 30 | 50 |  | 30 |
|  |  | PRIMASET PT-60 |  | 10 |  |  |  |  | 10 |  |  | 10 |
|  | EPOXY RESIN | NC-3000P | 25 | 25 | 10 | 30 | 15 | 17 | 20 |  | 50 | 50 |
|  | PHENOXY RESIN | YX-8100H30 | 5 | 5 | 5 | 5 | 10 | 3 | 5 | 5 | 7 | 3 |
|  |  | EP-4275 | 5 | 5 | 5 | 5 | 5 | 3 | 5 | 5 | 3 | 7 |
|  | CURING CATALYST | IMIDAZOLE COMPOUND | 0.4 | 0.4 | 0.4 | 0.4 | 0.4 | 0.4 | 0.4 | 0.4 | 0.4 | 0.8 |
|  | INORGANIC FILLER | SO-25H | 40 | 40 | 40 | 40 | 40 | 60 | 30 | 40 | 40 |  |
|  | COUPLING AGENT | A-187 | 0.2 | 0.2 | 0.2 | 0.2 | 0.2 | 0.3 | 0.2 | 0.2 | 0.2 |  |
|  | TOTAL |  | 100.6 | 100.6 | 100.6 | 100.6 | 100.6 | 100.7 | 100.6 | 100.6 | 100.6 | 100.8 |
| EVALUATION (RESIN-ATTACHED METAL FOIL) | GRASS TRANSITION TEMPERATURE | DMA (° C.) | 240 | 240 | 260 | 220 | 250 | 240 | 240 | 290 | 170 | 230 |
|  | LINEAR EXPANSION COEFFICIENT | TMA (ppm) | 30 | 30 | 25 | 33 | 35 | 20 | 38 | 23 | 40 | 45 |
| EVALUATION (MULTIPLE-LAYERED PRINTED WIRING BOARD) | FIRE RETARDANCY | UL-94 | V-0 | V-0 | V-0 | V-0 | V-0 | V-0 | V-0 | V-0 | V-1 | V-1 |
|  | FORMABILITY | PRESENCE OF VOIDS | OK | OK | OK | OK | OK | OK | OK | OK | OK | OK |
|  | SOLDER HEAT RESISTANCE AFTER HUMIDIFICATION | BLISTER/FLAKING | OK | OK | OK | OK | OK | OK | OK | NG | OK | OK |

TABLE 3

|  |  |  | EX. C1 | EX. C2 | EX. C3 | EX. C4 | EX. C5 | EX. C6 | EX. C7 | EX. C8 | EX. C9 | EX. C10 |
|---|---|---|---|---|---|---|---|---|---|---|---|---|
| FORMULATION OF RESIN COMPOSITION | CYANATE RESIN | PRIMASET PT-30 | 25 | 15 | 40 | 20 | 30 | 17 | 30 | 50 |  | 30 |
|  |  | PRIMASET PT-60 |  | 10 |  |  |  |  | 10 |  |  | 10 |
|  | EPOXY RESIN | NC-3000P | 25 | 25 | 10 | 30 | 15 | 17 | 20 |  | 50 | 50 |
|  | PHENOXY RESIN | YX-8100H30 | 10 | 10 | 10 | 10 | 15 | 6 | 10 | 10 | 10 | 10 |
|  | CURING CATALYST | IMIDAZOLE COMPOUND | 0.4 | 0.4 | 0.4 | 0.4 | 0.4 | 0.4 | 0.4 | 0.4 | 0.4 | 0.8 |
|  | INORGANIC FILLER | SO-25H | 40 | 40 | 40 | 40 | 40 | 60 | 30 | 40 | 40 |  |
|  | COUPLING AGENT | A-187 | 0.2 | 0.2 | 0.2 | 0.2 | 0.2 | 0.3 | 0.2 | 0.2 | 0.2 |  |
|  | TOTAL |  | 100.6 | 100.6 | 100.6 | 100.6 | 100.6 | 100.7 | 100.6 | 100.6 | 100.6 | 100.8 |
| EVALUATION (BASE MATERIAL-ATTACHED INSULATING SHEET) | GRASS TRANSITION TEMPERATURE | DMA (° C.) | 250 | 250 | 270 | 230 | 260 | 250 | 250 | 300 | 180 | 230 |
|  | LINEAR EXPANSION COEFFICIENT | TMA (ppm) | 30 | 30 | 25 | 33 | 35 | 20 | 38 | 23 | 40 | 45 |

TABLE 3-continued

|  |  |  | EX. C1 | EX. C2 | EX. C3 | EX. C4 | EX. C5 | EX. C6 | EX. C7 | EX. C8 | EX. C9 | EX. C10 |
|---|---|---|---|---|---|---|---|---|---|---|---|---|
| EVALUATION (MULTIPLE-LAYERED PRINTED WIRING BOARD) | FIRE RETARDANCY FORMABILITY | UL-94 | V-0 | V-0 | V-0 | V-0 | V-0 | V-0 | V-0 | V-0 | V-1 | V-1 |
|  |  | PRESENCE OF VOIDS | OK | OK | OK | OK | OK | OK | OK | OK | OK | OK |
|  | SOLDER HEAT RESISTANCE AFTER HUMIDIFICATION | BLISTER/FLAKING | OK | OK | OK | OK | OK | OK | OK | NG | OK | OK |

TABLE 4

|  |  |  | EX. D1 | EX. D2 | EX. D3 | EX. D4 | EX. D5 | EX. D6 | EX. D7 | EX. D8 | EX. D9 | EX. D10 |
|---|---|---|---|---|---|---|---|---|---|---|---|---|
| FORMULATION OF RESIN COMPOSITION | CYANATE RESIN | PRIMASET PT-30 | 25 | 15 | 40 | 20 | 30 | 17 | 30 | 50 |  | 30 |
|  |  | PRIMASET PT-60 |  | 10 |  |  |  |  | 10 |  |  | 10 |
|  | EPOXY RESIN | NC-3000P | 25 | 25 | 10 | 30 | 15 | 17 | 20 |  | 50 | 50 |
|  | PHENOXY RESIN | YX-8100H30 | 5 | 5 | 5 | 5 | 10 | 3 | 5 | 5 | 7 | 3 |
|  |  | EP-4275 | 5 | 5 | 5 | 5 | 5 | 3 | 5 | 5 | 3 | 7 |
|  | CURING CATALYST | IMIDAZOLE COMPOUND | 0.4 | 0.4 | 0.4 | 0.4 | 0.4 | 0.4 | 0.4 | 0.4 | 0.4 | 0.8 |
|  | INORGANIC FILLER | SO-25H | 40 | 40 | 40 | 40 | 40 | 60 | 30 | 40 | 40 |  |
|  | COUPLING AGENT | A-187 | 0.2 | 0.2 | 0.2 | 0.2 | 0.2 | 0.3 | 0.2 | 0.2 | 0.2 |  |
|  | TOTAL |  | 100.6 | 100.6 | 100.6 | 100.6 | 100.6 | 100.7 | 100.6 | 100.6 | 100.6 | 100.8 |
| EVALUATION (BASE MATERIAL-ATTACHED INSULATING SHEET) | GRASS TRANSITION TEMPERATURE | DMA (° C.) | 240 | 240 | 260 | 220 | 250 | 240 | 240 | 290 | 170 | 230 |
|  | LINEAR EXPANSION COEFFICIENT | TMA (ppm) | 30 | 30 | 25 | 33 | 35 | 20 | 38 | 23 | 40 | 45 |
| EVALUATION (MULTIPLE-LAYERED PRINTED WIRING BOARD) | FIRE RETARDANCY FORMABILITY | UL-94 | V-0 | V-0 | V-0 | V-0 | V-0 | V-0 | V-0 | V-0 | V-1 | V-1 |
|  |  | PRESENCE OF VOIDS | OK | OK | OK | OK | OK | OK | OK | OK | OK | OK |
|  | SOLDER HEAT RESISTANCE AFTER HUMIDIFICATION | BLISTER/FLAKING | OK | OK | OK | OK | OK | OK | OK | NG | OK | OK |

(1) Glass Transition Temperature (1.1) Resin-Attached Metal Foil

Two resin-attached metal foils were layered together so that the respective resin layer surfaces of the resin-attached metal foils were in the inner side thereof, and a hot pressure forming process of the obtained board was conducted by employing a vacuum pressing apparatus at a pressure of 2 MPa and a temperature of 200 degree C. for 2 hours, and then, the entire surface of the copper foil was etched to obtain a cured resin. An evaluation specimen of 10 mm×30 mm was sampled from the obtained cured resin, and was evaluated by employing a dynamic mechanical analyzer (DMA) (commercially available from TA Instruments) at a rate of an elevating temperature of 5 degree C./minute, and a glass transition temperature was defined as a peak position of tan δ.

(1.2) Base Material-Attached Insulating Sheet

Two base material-attached insulating sheets were layered so that the respective resin layer surfaces of the resin-attached metal foils were in the inner side thereof, and a hot pressure forming process of the obtained board was conducted by employing a vacuum pressing apparatus at a pressure of 2 MPa and a temperature of 200 degree C. for 2 hours, and then, the base material was stripped off to obtain a cured resin. An evaluation specimen of 10 mm×30 mm was cut out from the obtained cured insulating sheet, and was evaluated by employing a dynamic mechanical analyzer (DMA) (commercially available from TA Instruments) at a rate of an elevating temperature of 5 degree C./minute, and a glass transition temperature was defined as a peak position of tan δ.

(2) Linear Expansion Coefficient (2.1) Resin-Attached Metal Foil

Two resin-attached metal foils were laid together so that the respective resin layer surfaces of the resin-attached metal foils were in the inner side thereof, and a hot pressure forming process of the obtained board was conducted by employing a vacuum pressing apparatus at a pressure of 2 MPa and a temperature of 200 degree C. for 2 hours, and then, the entire surface of the copper foil was etched to obtain a cured resin. An evaluation specimen of 4 mm×20 mm was sampled from the obtained cured resin, and was evaluated by employing a thermo mechanical analyzer (TMA) (commercially available from TA Instruments) at a rate of an elevating temperature of 10 degree C./minute.

(2.2) Insulating Sheet

Two base material-attached insulating sheets were laid so that the respective resin layer surfaces of the resin-attached metal foils were in the inner side thereof, and a hot pressure forming process of the obtained board was conducted by employing a vacuum pressing apparatus at a pressure of 2 MPa and a temperature of 200 degree C. for 2 hours, and then, the base material was stripped off to obtain a cured resin. An evaluation specimen of 4 mm×20 mm was sampled from the obtained cured resin, and was evaluated by employing a thermo mechanical analyzer (TMA) (commercially available from TA Instruments) at a rate of an elevating temperature of 10 degree C./minute.

(3) Fire Retardancy

The entire copper foil of the multiple-layered printed wiring board was etched off, and the obtained product was evaluated according to UL-94 vertical flame test.

(4) Formability

The entire copper foil of the multiple-layered printed wiring board was etched off, and a presence of forming voids was observed by a visual inspection.

(5) Solder Heat Resistance after Humidification

A specimen of 50 mm×50 mm was sampled from the multiple-layered printed wiring board, and copper foils on an entire surface of one side and on a half of a surface of another side were etched off. This was treated in a pressure cooker at 125 degree C. for 2 hours, and then, was floated in a solder bath at 260 degree C. for 180 seconds while keeping the copper foil surface down, and then, a presence of a blister and/or a flaking-off was confirmed.

Experimental Examples A1 to A7 and B1 to B7 are directed to resin compositions of the present embodiment, and to resin-attached metal foils and multiple-layered printed wiring boards employing thereof, the resin compositions comprising: a cyanate resin and/or a prepolymer thereof; an epoxy resin containing substantially no halogen atom; a phenoxy resin which containing substantially no halogen atom; an imidazole compound; and an inorganic filler.

In addition, Experimental Examples C1 to C7 and D1 to D7 are directed to resin compositions of the present embodiment, and to base material-attached insulating sheets and multiple-layered printed wiring boards employing thereof, the resin compositions comprising: a cyanate resin and/or a prepolymer thereof; an epoxy resin containing substantially no halogen atom; a phenoxy resin which containing substantially no halogen atom; an imidazole compound; and an inorganic filler.

In each of Experimental Examples A1 to A7, B1 to B7, C1 to C7 and D1 to D7, increased glass transition temperature and lower linear expansion coefficient are exhibited, and improved fire retardancy, formability and thermal resistance are exhibited.

While an increased glass transition temperature was achieved due to a use of a cyanate resin in each of Experimental Examples A8, B8, C8 and D8, a reduced thermal resistance was exhibited because of employing no epoxy resin.

Since a cyanate resin was not employed in each of Experimental Examples A9, B9, C9 and D9, a glass transition temperature was reduced, and a fire retardancy was also deteriorated.

Since an inorganic filler was not employed in each of Experimental Examples A10, B10, C10 and D10, a linear expansion coefficient was increased, and a fire retardancy was also deteriorated.

The invention claimed is:

1. A resin composition, capable of being employed for forming a resin layer of a resin-attached metal foil, comprising:
   a cyanate resin and/or a prepolymer thereof;
   an epoxy resin substantially containing no halogen atom;
   a phenoxy resin substantially containing no halogen atom;
   an imidazole compound; and
   an inorganic filler,
   wherein said cyanate resin is present in a range of from 5 to 50% wt. of said resin composition,
   said epoxy resin is present in a range of from 5 to 50% wt. of said resin composition,
   said phenoxy resin is present in a range of from 1 to 40% wt. of said resin composition,
   said imidazole compound is present in a range of from 0.05 to 5% wt. of the combination of the said cyanate resin and said epoxy resin and,
   said inorganic filler is present in a range of from 20 to 70% wt. of said resin composition.

2. The resin composition according to claim 1, wherein said cyanate resin is a novolac cyanate resin.

3. The resin composition according to claim 1, wherein said epoxy resin is an aryl alkylene epoxy resin.

4. The resin composition according to claim 1, wherein said imidazole compound has two or more functional groups selected from a group consisting of aliphatic hydrocarbon group, aromatic hydrocarbon group, hydroxyalkyl group and cyano alkyl group.

5. A resin-attached metal foil, formed by cladding a metal foil with the resin composition according to claim 1.

6. A multiple-layered printed wiring board, formed by laying the resin-attached metal foil(s) according to claim 5 on a single side or both sides of an internal layer circuit board and hot pressure forming thereof.

7. A resin composition, capable of being employed for forming an insulating sheet of a base material-attached insulating sheet, comprising:
   a cyanate resin and/or a prepolymer thereof;
   an epoxy resin substantially containing no halogen atom;
   a phenoxy resin substantially containing no halogen atom;
   an imidazole compound; and
   an inorganic filler,
   wherein said cyanate resin is present in a range of from 5 to 50% wt. of said resin composition,
   said epoxy resin is present in a range of from 5 to 50% wt. of said resin composition,
   said phenoxy resin is present in a range of from 1 to 40% wt. of said resin composition,
   said imidazole compound is present in a range of from 0.05 to 5% wt. of the combination of the said cyanate resin and said epoxy resin and,
   said inorganic filler is present in a range of from 20 to 70% wt. of said resin composition.

8. The resin composition according to claim 7, wherein said cyanate resin is a novolac cyanate resin.

9. The resin composition according to claim 7, wherein said epoxy resin is an aryl alkylene epoxy resin.

10. The resin composition according to claim 7, wherein said imidazole compound has two or more functional groups selected from a group consisting of aliphatic hydrocarbon group, aromatic hydrocarbon group, hydroxyalkyl group and cyano alkyl group.

11. A base material-attached insulating sheet, formed by cladding an insulating base material with the resin composition according to claim 7.

12. A multiple-layered printed wiring board, formed by laying the base material-attached insulating sheet(s) according to claim 11 on a single side or both sides of an internal layer circuit board and hot pressure forming thereof.

* * * * *